(12) United States Patent
Rajavelu Muralidhar et al.

(10) Patent No.: US 12,270,106 B2
(45) Date of Patent: *Apr. 8, 2025

(54) SUBSTRATE RETAINING APPARATUS, SYSTEM INCLUDING THE APPARATUS, AND METHOD OF USING SAME

(71) Applicant: ASM IP Holding B.V., Almere (NL)

(72) Inventors: Shiva K. T. Rajavelu Muralidhar, Tempe, AZ (US); Sam Kim, Chandler, AZ (US); Jeffrey Barrett Robinson, Chandler, AZ (US); James King Wilson, Jr., Gilbert, AZ (US); Ninad Vijay Sonje, Thane (IN)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/402,969

(22) Filed: Jan. 3, 2024

(65) Prior Publication Data

US 2024/0133035 A1  Apr. 25, 2024

Related U.S. Application Data

(63) Continuation of application No. 16/584,283, filed on Sep. 26, 2019, now Pat. No. 11,885,023.

(60) Provisional application No. 62/739,733, filed on Oct. 1, 2018.

(51) Int. Cl.
| | |
|---|---|
| *H01L 21/67* | (2006.01) |
| *C23C 16/44* | (2006.01) |
| *C23C 16/458* | (2006.01) |
| *C23C 16/46* | (2006.01) |
| *H01L 21/687* | (2006.01) |

(52) U.S. Cl.
CPC ........ *C23C 16/466* (2013.01); *C23C 16/4411* (2013.01); *C23C 16/4586* (2013.01); *H01L 21/67201* (2013.01); *H01L 21/68757* (2013.01)

(58) Field of Classification Search
CPC ........ H01L 21/68771; H01L 21/67303; H01L 21/67109; H01L 21/67201; H01L 21/68757; C23C 16/466; C23C 16/4411; C23C 16/4586; C23C 16/4557
USPC ....................................... 165/80.2
See application file for complete search history.

(56) References Cited

U.S. PATENT DOCUMENTS

| | | | | |
|---|---|---|---|---|
| 3,623,712 A | * | 11/1971 | McNeilly | F27B 17/02 148/DIG. 71 |
| 4,179,530 A | * | 12/1979 | Koppl | C23C 16/22 423/349 |
| 5,626,680 A | * | 5/1997 | Porter | H01L 21/67309 118/728 |

(Continued)

FOREIGN PATENT DOCUMENTS

JP  2003100579 A  4/2003

*Primary Examiner* — Charlee J. C. Bennett
(74) *Attorney, Agent, or Firm* — Snell & Wilmer L.L.P.

(57) ABSTRACT

A substrate retaining apparatus, a load lock assembly comprising the substrate retaining apparatus, and a system including the substrate retaining apparatus are disclosed. The substrate retaining apparatus can include at least one sidewall and one or more heat shields. One or more of the at least one sidewall can include a cooling fluid conduit to facilitate cooling of substrates retained by the substrate retaining apparatus. Additionally or alternatively, one or more of the at least one sidewall can include a gas conduit to provide gas to a surface of a retained substrate.

20 Claims, 15 Drawing Sheets

(56) References Cited

U.S. PATENT DOCUMENTS

| | | | | |
|---|---|---|---|---|
| 5,850,071 | A * | 12/1998 | Makiguchi | H01L 21/67109 |
| | | | | 219/390 |
| 6,279,506 | B1 * | 8/2001 | Jurgensen | C23C 16/45504 |
| | | | | 422/186 |
| 10,297,480 | B2 * | 5/2019 | Maraschin | H01L 21/67393 |
| 11,315,806 | B2 * | 4/2022 | Schaller | H01L 21/67017 |
| 2002/0076490 | A1 * | 6/2002 | Chiang | H01J 37/32449 |
| | | | | 257/E21.171 |
| 2003/0060030 | A1 * | 3/2003 | Lee | H01L 21/02046 |
| | | | | 257/E21.252 |
| 2003/0132213 | A1 * | 7/2003 | Kim | H01L 21/67109 |
| | | | | 219/390 |
| 2003/0161706 | A1 * | 8/2003 | Kurita | H01L 21/68792 |
| | | | | 414/217 |
| 2005/0039686 | A1 * | 2/2005 | Zheng | C23C 16/45578 |
| | | | | 118/728 |
| 2006/0196418 | A1 * | 9/2006 | Lindfors | C23C 16/45546 |
| | | | | 118/728 |
| 2007/0243317 | A1 * | 10/2007 | Du Bois | C23C 16/4583 |
| | | | | 118/725 |
| 2013/0284683 | A1 * | 10/2013 | Jdira | H01L 21/67309 |
| | | | | 211/41.18 |
| 2014/0271054 | A1 * | 9/2014 | Weaver | H01L 21/68707 |
| | | | | 414/217.1 |
| 2016/0118282 | A1 | 4/2016 | Maraschin et al. | |
| 2016/0218028 | A1 * | 7/2016 | Schaller | H01L 21/67109 |
| 2019/0057885 | A1 * | 2/2019 | Delmas | F27B 9/36 |
| 2019/0259638 | A1 | 8/2019 | Schaller et al. | |

* cited by examiner

SUBSTRATE RETAINING APPARATUS, SYSTEM INCLUDING THE APPARATUS, AND METHOD OF USING SAME

CROSS-REFERENCE TO RELATED APPLICATIONS

This application is a continuation of, and claims priority to and the benefit of, U.S. patent application Ser. No. 16/584,283, filed Sep. 26, 2019 and entitled "SUBSTRATE RETAINING APPARATUS, SYSTEM INCLUDING THE APPARATUS, AND METHOD OF USING SAME," which is a non-provisional application of, and claims priority to and the benefit of, U.S. Provisional Application No. 62/739,733, entitled "SUBSTRATE RETAINING APPARATUS, SYSTEM INCLUDING THE APPARATUS, AND METHOD OF USING SAME" and filed on Oct. 1, 2018, which are hereby incorporated by reference herein.

FIELD OF THE DISCLOSURE

The present disclosure generally relates to apparatus for substrate processing. More particularly, the disclosure relates to an apparatus for retaining and cooling substrates and to reactor systems including the apparatus.

BACKGROUND OF THE DISCLOSURE

Reactor systems for processing substrates, such as semiconductor substrates, often include one or more reaction chambers, one or more load locks, and one or more substrate transfer systems. Each reaction chamber can be used for one or more processes, such as depositing material onto, etching material from, and/or cleaning a surface of a substrate. For example, gas-phase reaction chambers can be used to deposit, etch, and/or clean material on a substrate surface. The load locks can be used to temporarily store or retain substrates—e.g., under vacuum conditions—prior to entering or after exiting one or more of the reaction chambers. More particularly, the load locks can receive substrates from an ambient environment, such as a cleanroom environment and/or a cassette loading station, expose the substrates to a vacuum pressure or other conditions that are similar to process conditions in the one or more reaction chambers, and store the substrate until the substrates are transferred to the reaction chamber and/or store substrates received from the reaction chamber until the substrates are transferred to the ambient environment. The substrates can be transferred between the reaction chamber and the load lock using the substrate handling system, which can operate at or near the same pressure as a reaction chamber and/or a load lock.

Many processes within a reaction chamber are carried out at elevated substrate temperatures. When hot substrates are removed from the reaction chamber and placed in the load lock, a surface of the substrate can oxidize, and an amount of oxidation on the surface can vary according to thermal history of the load lock, a position of the substrate within the load lock, thermal crosstalk between substrates—e.g., incoming and outgoing substrates, and the like. The surface oxidation can vary between substrates and/or across a surface of a substrate, such as along a radial surface of the substrate. Any variation in the oxidation of the surface can cause unwanted process variation in subsequent processing, such as a pre-clean process for the removal of native oxides, carbon and/or other materials for, for example, integrated pre-epi and/or other surface preparation.

Additionally, it can take a relatively long time for substrates to cool to a desired temperature before the substrates are transferred from the load lock—e.g., to another reaction chamber or to the ambient environment. The relatively long cooling time can add unwanted time and expense to devices formed using such methods. Further, a relatively hot substrate may undesirably heat a relatively cool substrate. Outgassing of relatively hot substrates can also pose a problem within a load lock. Accordingly, improved apparatus for retaining and rapidly cooling substrates to a desired temperature, and systems including such apparatus are desired.

SUMMARY OF THE DISCLOSURE

Various embodiments of the present disclosure relate to apparatus for retaining substrates—e.g., within a load lock of a reactor system. While the ways in which various embodiments of the present disclosure address drawbacks of prior substrate retention apparatuses and load locks are discussed in more detail below, in general, various embodiments of the disclosure provide a substrate retaining apparatus that can rapidly cool substrates to desired temperatures, mitigate thermal crosstalk between substrates, mitigate undesired surface oxidation of a surface of a substrate, mitigate variation of temperatures across the surface of the substrate, and/or reduce contamination on the substrate surface.

In accordance with exemplary embodiments of the disclosure, a substrate retaining apparatus includes a baseplate, at least one sidewall coupled to the baseplate, and at least one heat shield coupled to the sidewall. The substrate retaining apparatus can also include at least one pad coupled to and projecting from a sidewall of the at least one sidewall. In accordance with various aspects of these embodiments, the at least one pad is configured to receive a substrate, such as a semiconductor wafer. In accordance with further aspects, the at least one sidewall comprises at least one cooling fluid conduit configured to allow a cooling fluid to flow therethrough. The flow of the cooling fluid through a cooling fluid conduit can facilitate rapid cooling of the substrate(s). Use of cooled sidewalls allows handling and cooling of substrates, such as semiconductor wafers, with minimal contact, thereby mitigating damage to the substrate. The at least one sidewall can additionally or alternatively include a gas conduit. Exemplary substrate retaining apparatus can include a plurality (e.g., at least two) sidewalls that are coupled to the baseplate. The baseplate can include one or more cooling fluid manifolds for the cooling fluid and/or for a gas; such manifold(s) can be coupled to the corresponding conduit(s) within the sidewall(s). The at least one sidewall can include openings—e.g., above and/or below the at least one pad—to provide gas from the gas conduit across a surface of a substrate to, for example, mitigate particle accumulation on the substrate surface and/or facilitate rapid cooling of the substrate. The heat shield can be formed of, for example, one or more of silicon carbide, stainless steel, or the like. The heat shield can include one or more coatings, such as coatings of emissive material and/or reflective material. For example, the heat shield can include an emissive coating proximate a bottom surface of a substrate and a reflective coating proximate a top surface of another substrate. The pad can be formed of, for example, quartz.

In accordance with at least one other embodiment of the disclosure, a load lock assembly includes a substrate retaining apparatus, such as a substrate retaining apparatus as described herein. The load lock assembly can further include a shaft to receive cooling fluid and/or gas lines, a mechanism to cause the substrate retaining apparatus to move—e.g., up and down, and a seal to allow vacuum conditions within an interior of the assembly, relative to an exterior of the assembly.

In accordance with yet additional embodiments of the disclosure, a reactor system includes a substrate retaining apparatus and/or a load lock assembly, such as those described herein. The reactor system can include a plurality of retaining apparatus and/or load lock assemblies. In addition, the reactor system can include one or more reaction chambers and one or more substrate handling systems.

BRIEF DESCRIPTION OF THE DRAWING FIGURES

A more complete understanding of exemplary embodiments of the present disclosure can be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates to substrate retaining apparatus, load lock assemblies including the substrate retaining apparatus, and reactor systems including the substrate retaining apparatus and/or load lock assemblies. Exemplary substrate retaining apparatus described herein can be used to rapidly cool one or more substrates, reduce thermal crosstalk between substrates, reduce temperature variation across a surface of a substrate within a substrate retaining apparatus, mitigate undesired surface oxidation of a surface of a substrate, and/or reduce contamination on a substrate surface.

Figure 1:
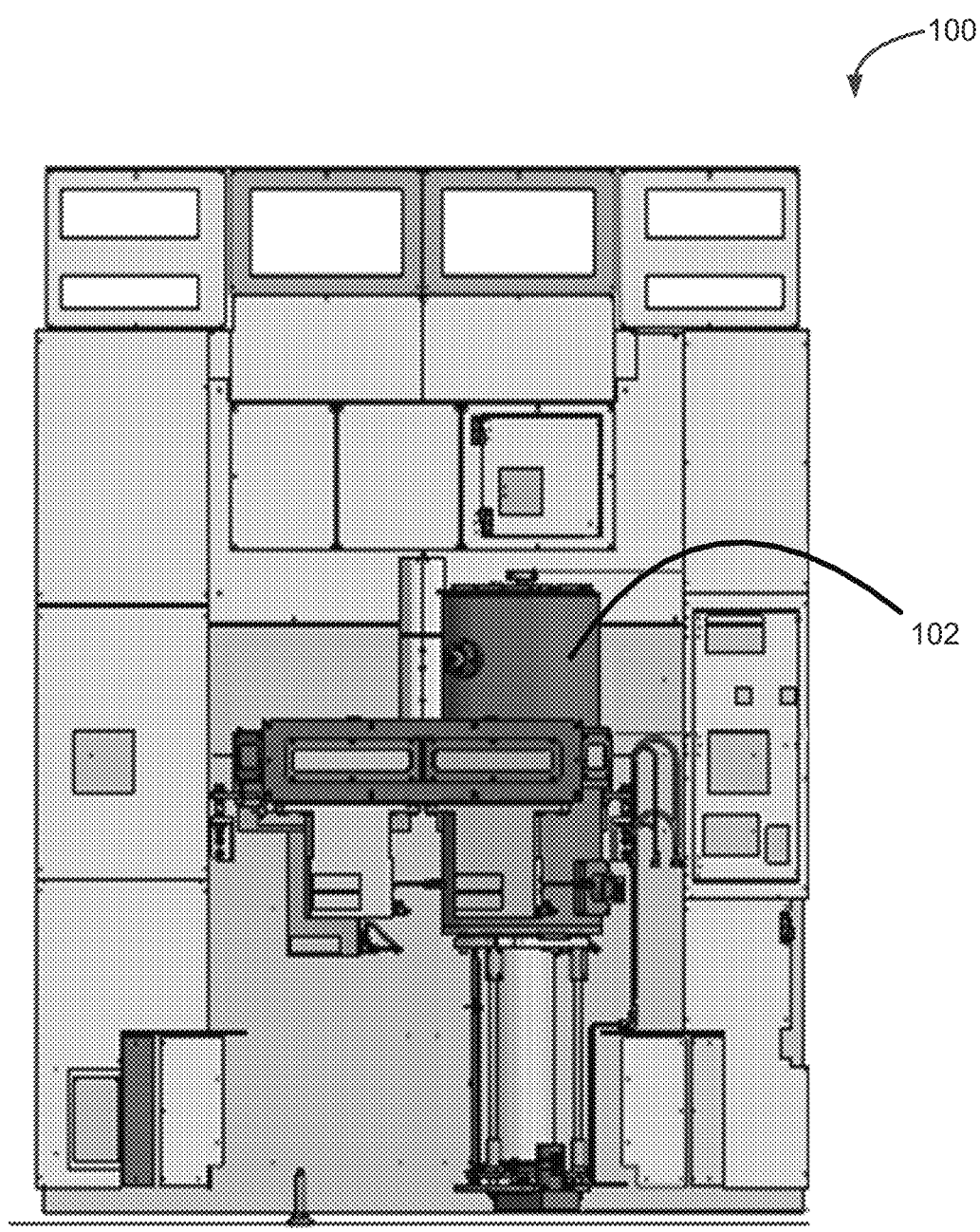
FIG. 1 is a front elevation illustration of a reactor system in accordance with at least one exemplary embodiment of the present disclosure.

FIG. 1 illustrates a front elevation view of a reactor system 100 in accordance with exemplary embodiments of the disclosure. Reactor system 100 includes a load lock assembly 102, one or more substrate handling systems (not illustrated) and one or more reaction chambers (not illustrated). Reactor system 100 can be used to perform a variety of processes, such as deposition, etch, and/or clean processes. By way of examples, reactor system 100 can include one or more reaction chambers to perform a deposition process, such as a chemical vapor deposition process for, for example, epitaxial layer deposition; a pre-clean reaction chamber, and the like. The epitaxial layer deposition reaction chambers can include, for example, a cold wall, single substrate reaction chamber.

As set forth in more detail below, load lock assembly 102 can be used to temporarily retain substrates before and/or after processing. For example, load lock assembly 102 can be used to retain substrates at a reduced pressure (e.g., about 5 Torr to about 100 Torr) and/or in a non-oxidizing environment (e.g., an inert gas environment) to mitigate oxidation on a surface of a substrate, to mitigate contamination, and/or to temporarily store the substrates at a pressure or near a pressure in one or more reaction chambers of reactor system 100. Suitable inert gasses include, for example, nitrogen, argon, and helium (it is noted that use of helium could also improve substrate cooling).

Figure 2:
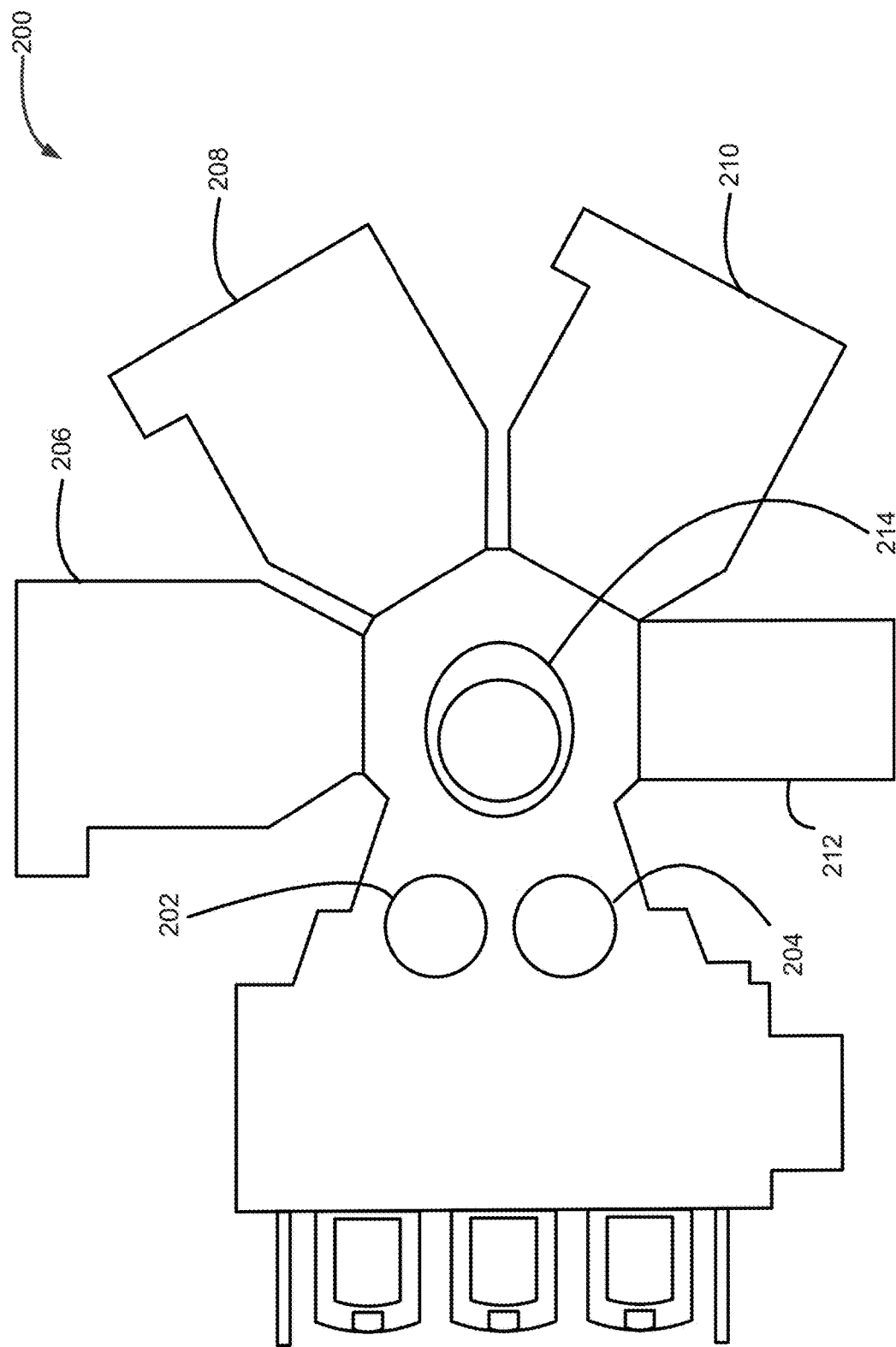
FIG. 2 is a cut-away illustration of another reactor system in accordance with at least one exemplary embodiment of the present disclosure.

FIG. 2 illustrates another reactor system 200, which includes load lock assemblies 202, 204; reaction chambers 206-212; and substrate handling system 214. In the illustrated example, reaction chamber 206-210 can be used for, for example, deposition processes, and reaction chamber 212 can be used for, for example, a pre-clean process. Load lock assemblies 202, 204 can be the same or similar to load lock assembly 102. Reaction chambers 206-212 can be the same or similar to reaction chambers described above and elsewhere herein. Substrate handling system 214 is configured to move substrates between load lock assemblies 202, 204 and one or more of reaction chamber 206-212. As discussed in more detail below in connection with FIG. 13, substrate handling system 214 can include a robotic blade that can place substrates within and/or remove substrates from the load lock assembly/assemblies and reaction chamber(s).

Figure 3A:
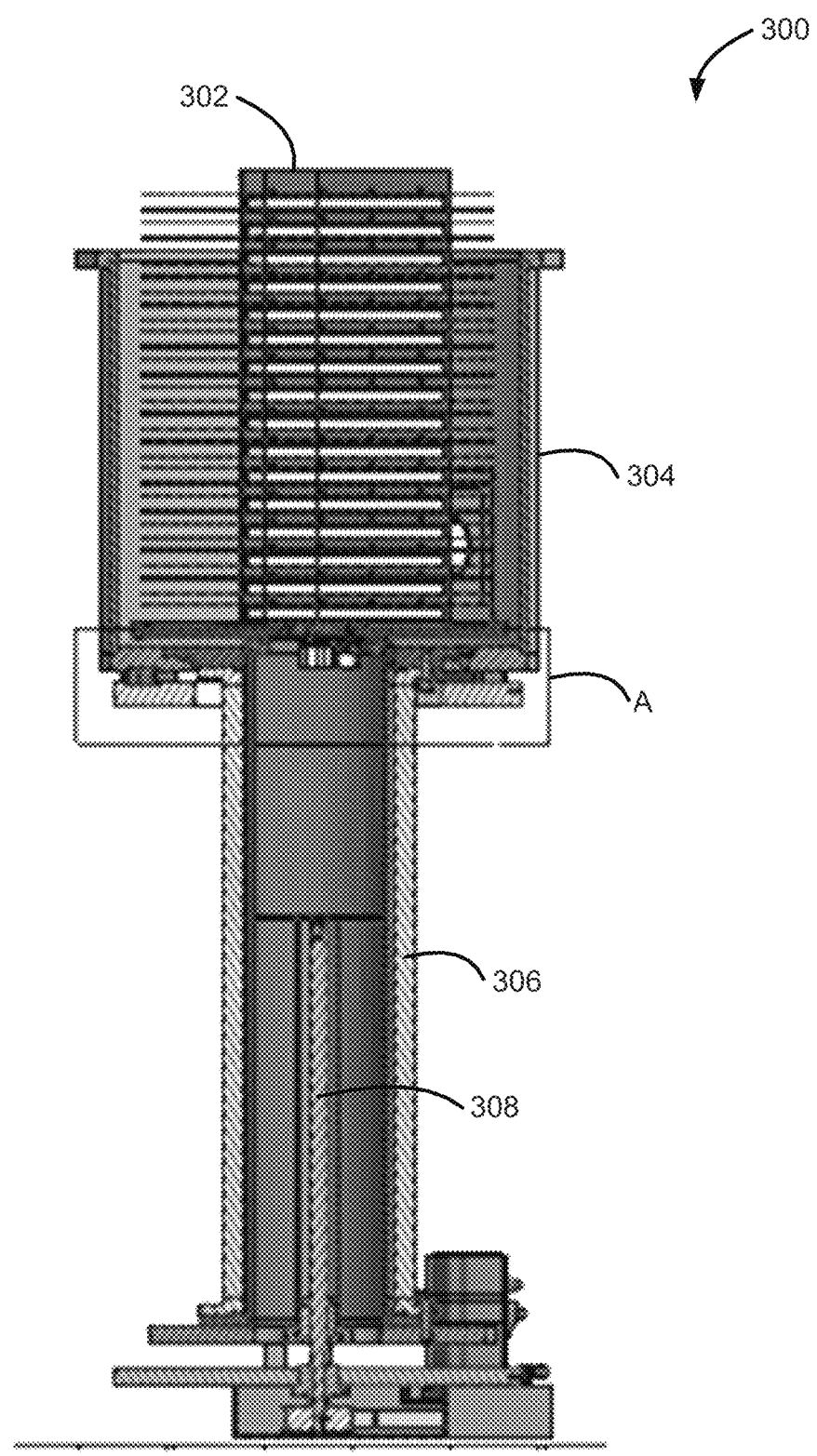
FIGS. 3A and 3B illustrate a load lock assembly in accordance with at least one embodiment of the disclosure.
Figure 3B:
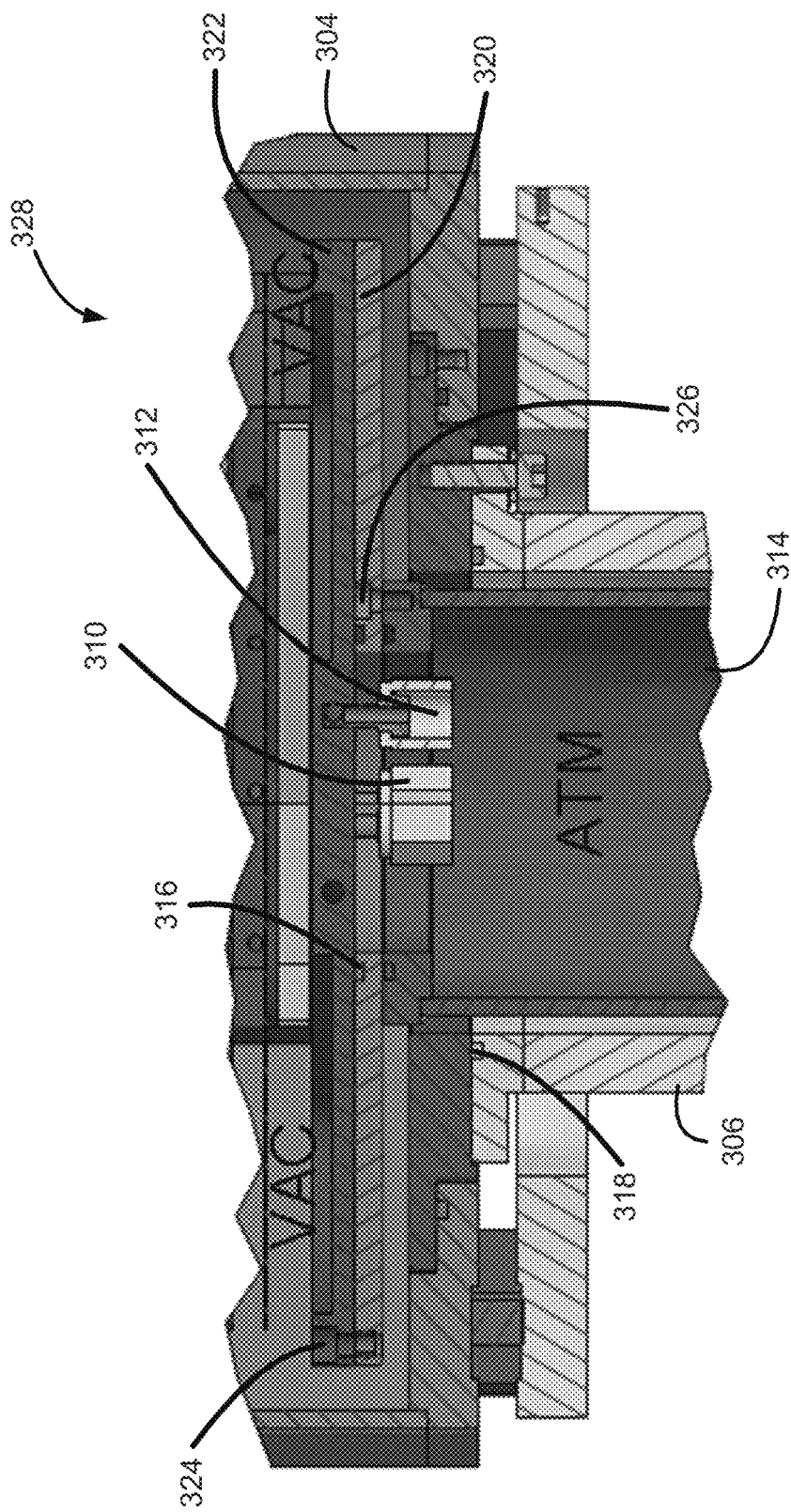

Turning now to FIGS. 3A and 3B, a load lock assembly 300 in accordance with exemplary embodiments of the disclosure is illustrated. FIG. 3A illustrates a cut-away view of load lock assembly 300 and FIG. 3B illustrates an enlarged view of a portion A of load lock assembly 300. Load lock assembly 300 can be the same or similar to any of load lock assemblies 102, 202, 204.

In the illustrated example, load lock assembly 300 includes a substrate retaining apparatus 302, a housing 304, a shaft 306, and a mechanism 308 configured to cause substrate retaining apparatus 302 to move—e.g., in an up and down direction. Load lock assembly 300 can also include one or more connectors 310 to connect one or more cooling fluid lines to substrate retaining apparatus 302 and/or one or more connectors 312 to connect one or more gas lines to substrate retaining apparatus 302.

Housing 304 can be formed of any suitable material. By way of examples, housing 304 can be formed of stainless steel or aluminum alloys. Housing 304 can be sized to accommodate substrate retaining apparatus 302, and can depend on, for example, a number and/or size of substrates retained. An exemplary height of housing 304 can range from, for example, about 300 to about 500 mm, and a cross-sectional dimension (e.g., diameter) of housing 304 can range from about 350 to about 500; these dimensions, as well as other dimensions provided herein are illustrative, and are not meant to be limiting.

Figure 6:
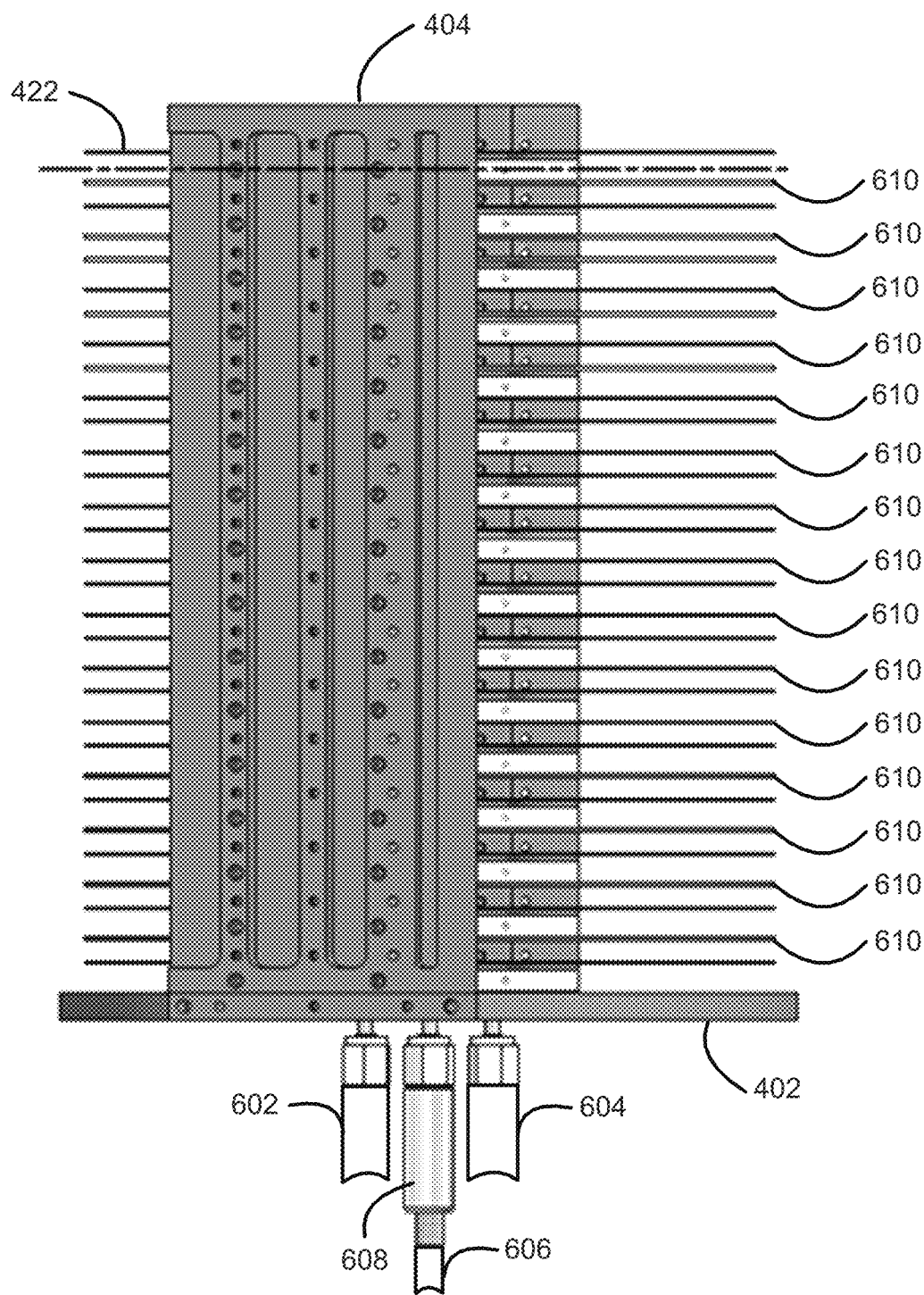

Shaft 306 can be configured to receive and house one or more cooling fluid lines. For example, shaft 306 can receive an inlet line for the cooling fluid and an outlet line for the cooling fluid. Each cooling fluid line (e.g., inlet and outlet) can be coupled to a connector 310. Exemplary cooling fluid lines 602, 604 are illustrated in FIG. 6. An exemplary cooling fluid includes water and Galden® heat transfer fluids. A flowrate of the cooling fluid through the cooling fluid line(s) can range from, for example, about 2 to about 10 liters per minute. Additionally or alternatively, shaft 306 can receive one or more gas lines, such as gas line 606, illustrated in FIG. 6. Each gas line can be coupled to a connector 312 and optionally a gas filter 608. Exemplary gasses that can flow through gas line(s) 606 include an inert gas as described herein. By way of particular example, the gas may comprise nitrogen. In various embodiments, the gas may comprise high-purity nitrogen gas to mitigate any risk of contaminants around the substrates (e.g., particles contacting or interacting with the substrates). A flowrate of gas through the gas line(s) 606 can range from, for example, about 1 liter per minute to about 100 liters per minute. Shaft 306 can be in the form of a bellow. A diameter of shaft 306 can range from, for example, about 60 mm to about 150 mm or be about 112 mm and a length of shaft 306 can range from, for example, about 550 mm to about 650 mm or be about 591.5 mm.

Mechanism 308 can include any suitable device to cause substrate retaining apparatus 302 to move. In the illustrated example, mechanism 308 includes a ball screw. A length of a ball screw may vary according to application. By way of illustrative example, a ball screw length can range from about 450 mm to about 540 mm or be about 490 mm.

During substrate processing, portions of load lock assembly 300, e.g., an exterior of load lock assembly 300 and an interior 314 of shaft 306, can be exposed to an ambient environment, such as atmospheric pressure, while an interior 328 of load lock assembly 300 can be exposed to vacuum conditions. This allows the substrates to be maintained at a pressure that is closer to a pressure within a reaction chamber, a pressure within the substrate handling system, and/or in an environment that mitigates contamination on a substrate surface.

Load lock assembly 300 can include one or more O-rings 316, 318 to form a seal between portions of load lock assembly 300 exposed to vacuum conditions and portions of load lock assembly 300 exposed to ambient conditions during processing. In the illustrated example, O-ring 316 forms a seal between an intermediate plate 320 and a baseplate 322 of substrate retaining apparatus 302, and O-ring 318 forms a seal between intermediate plate 320 and shaft 306. Various fasteners 324, 326, such as screws, bolts, or the like, can be used to couple together intermediate plate 320 and a baseplate 322 and/or intermediate plate 320 and shaft 306.

Figure 4:
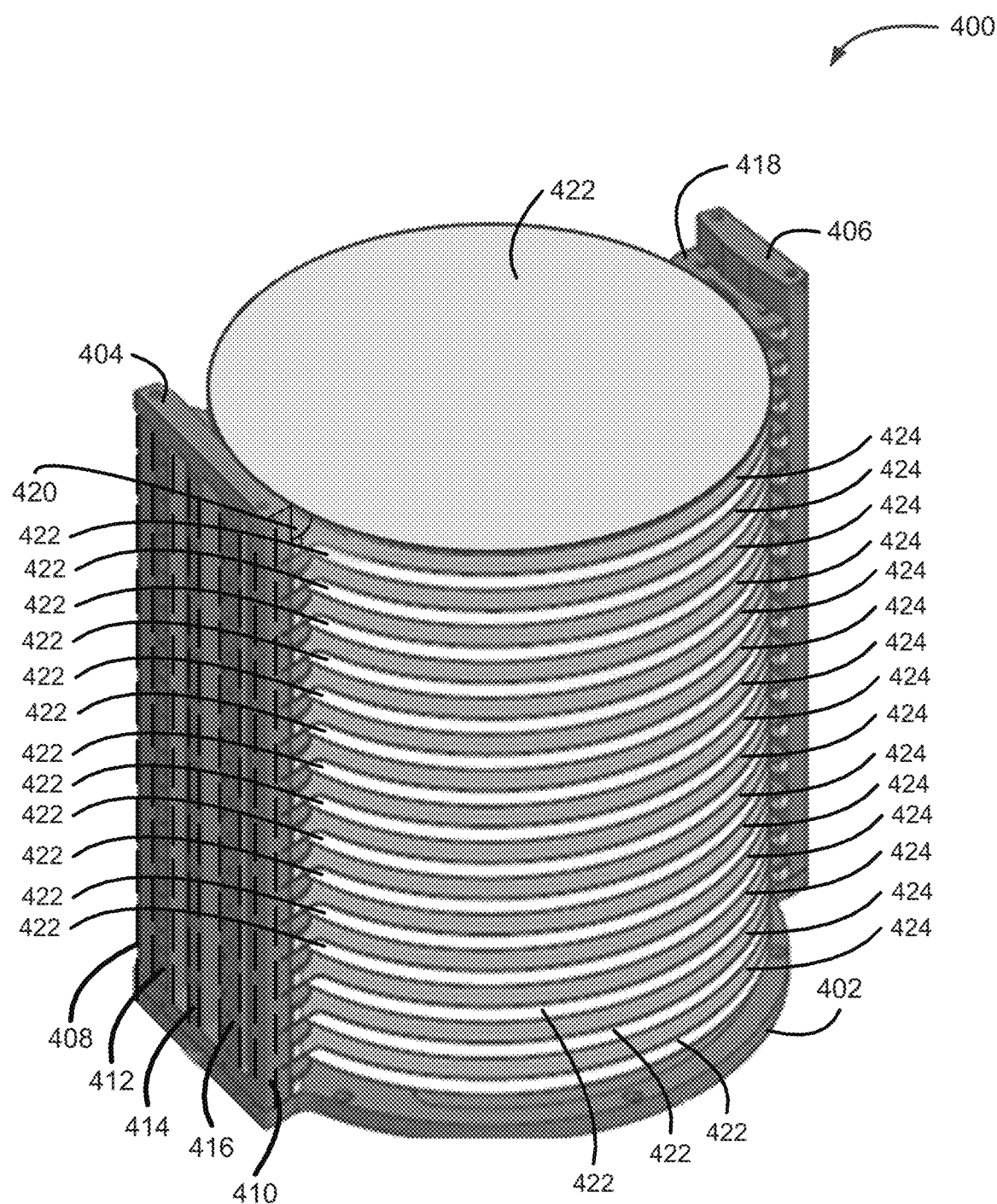
FIGS. 4-6 illustrate substrate retaining apparatus in accordance with exemplary embodiments of the disclosure.
Figure 5:
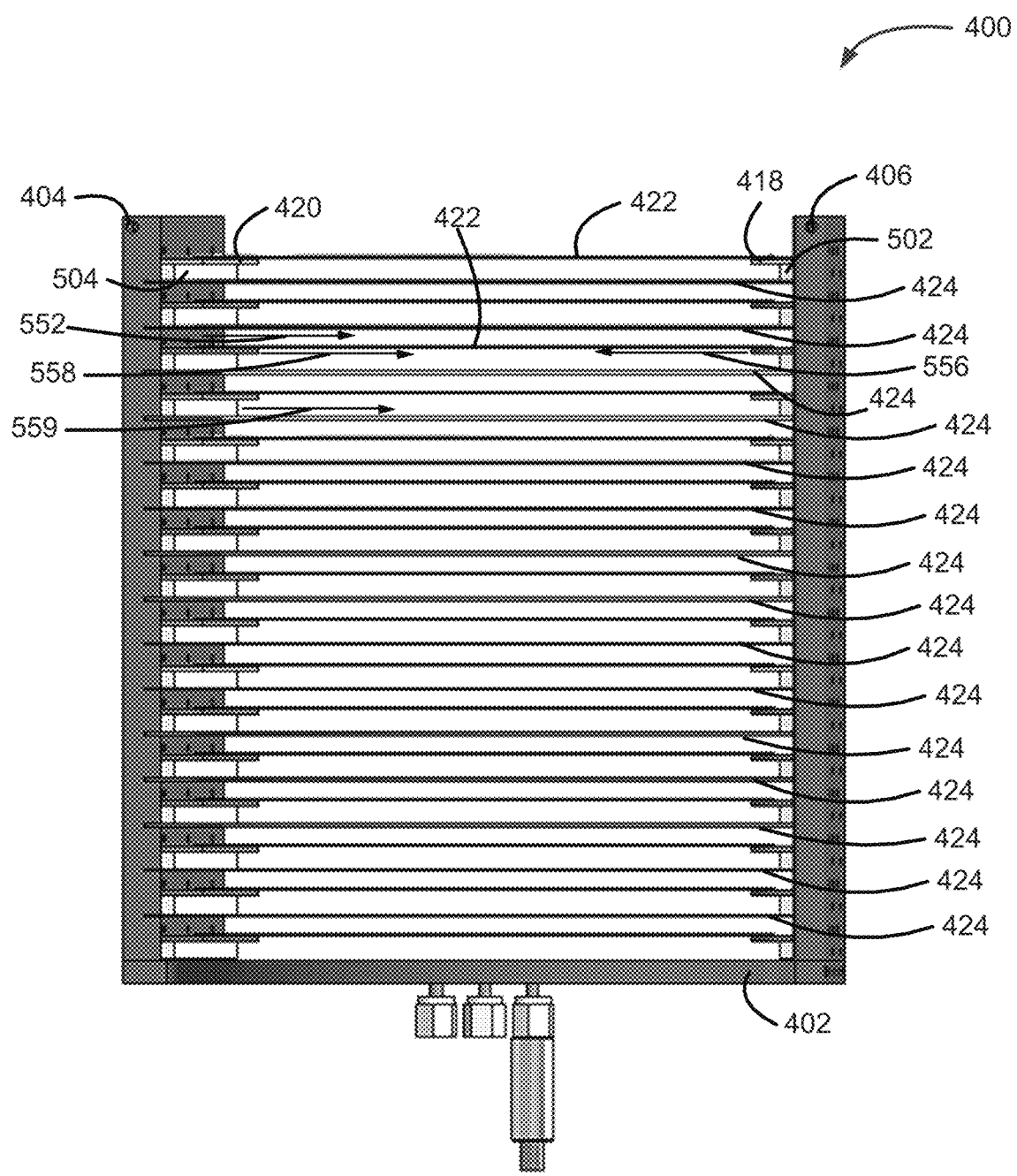

FIGS. 4 and 5 illustrate a substrate retaining apparatus 400 in accordance with exemplary embodiments of the disclosure. Substrate retaining apparatus 400 is configured to retain a plurality of substrates, while mitigating thermal crosstalk between the substrates, allowing for relatively rapid cooling of the substrates, and/or providing other advantages as described herein. Substrate retaining apparatus 400 can be suitable for use as substrate retaining apparatus 302.

Substrate retaining apparatus 400 includes a baseplate 402 (which can be the same or similar to baseplate 322), a first sidewall 404, and a second sidewall 406. Although illustrated with two sidewalls 404, 406, substrate retaining apparatus 400 can include any suitable number of sidewalls, such as one or more or at least two sidewalls. Substrate retaining apparatus 400 also includes at least one heat shield 424 coupled to one or more of first sidewall 404 and second sidewall 406. As illustrated, substrate retaining apparatus 400 can include at least one heat shield between substrates 422, such that a plurality of substrates and a plurality of heat shields 424 are in an alternating pattern.

Figure 7:
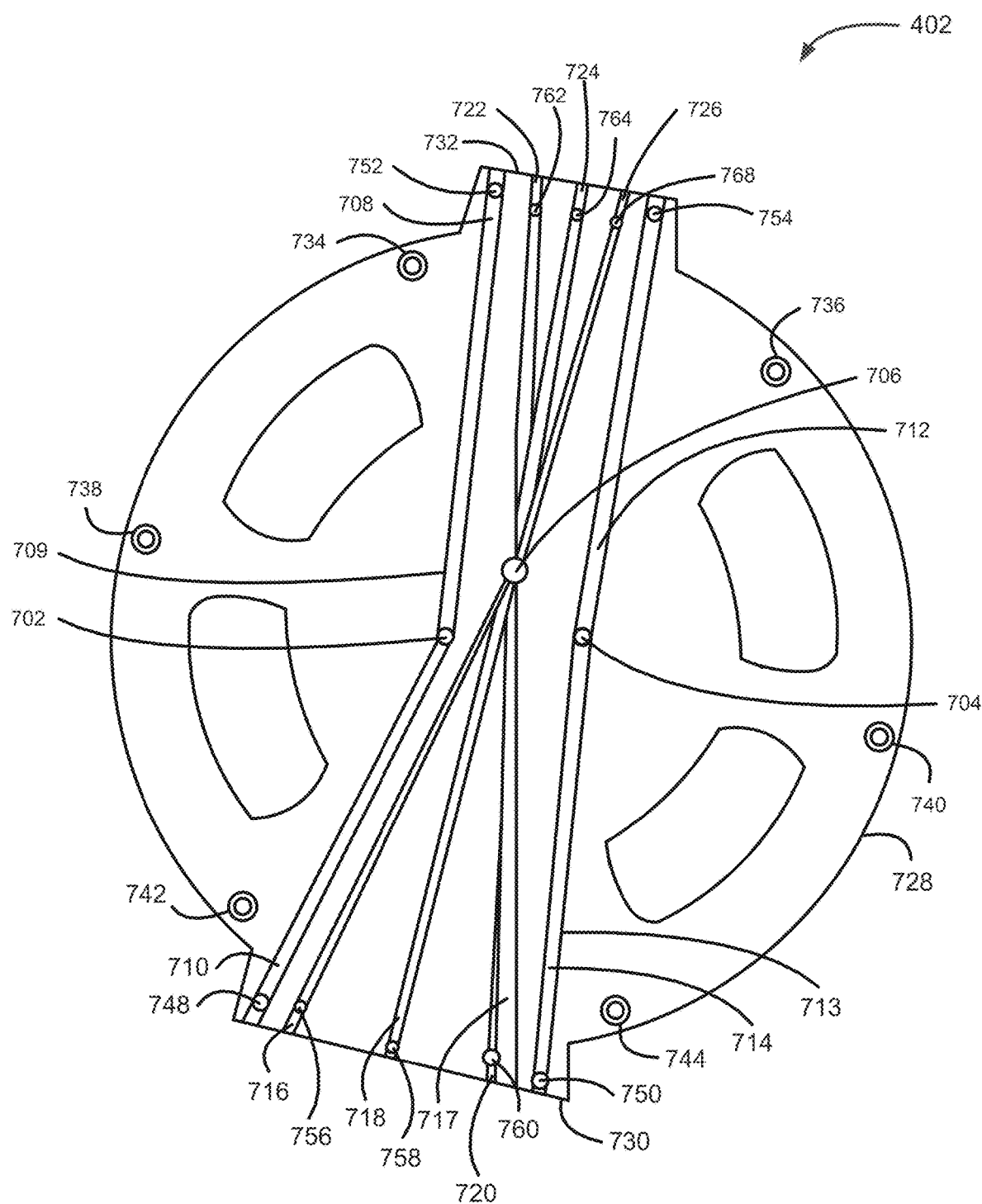
FIG. 7 illustrates a baseplate in accordance with at least one embodiment of the disclosure.

Baseplate 402 is illustrated in more detail in FIG. 7, which illustrates a top view of baseplate 402. Baseplate 402 includes a first opening 702 to receive a cooling fluid, such as water, a second opening 704 to allow the cooling fluid to exit baseplate 402, and a third opening 706 to receive a gas, such as an inert gas, as described herein. Although illustrated with two openings for cooling fluid and one opening for gas, baseplate 402 can include any suitable number of openings for cooling fluid and/or gas. In the illustrated example, baseplate 402 also includes a cooling fluid manifold 709 that includes one or more channels 708, 710 to distribute cooling fluid received at opening 702 to a periphery of baseplate 402. Baseplate 402 also includes a cooling fluid manifold 713 that includes channels 712, 714 to receive return cooling fluid from the periphery of baseplate 402, such that the cooling fluid can exit baseplate 402 at opening 704. Baseplate 402 also includes a gas manifold 717 that includes channels 716-726 that are configured to allow a flow of gas received at opening 706 to an edge of baseplate 402.

Baseplate 402 can include a substantially circular section 728 and sections 730, 732 that include substantially flat or linear sections. Sections 730, 732 can be used to couple baseplate 402 to sidewalls 404, 406 and/or to other sidewalls as described herein. Baseplate 402 can be coupled to an intermediate plate, such as intermediate plate 320, using fasteners, such as bolts or screws—e.g., using holes 734-744 formed within baseplate 402.

Returning now to FIG. 4, sidewalls 404, 406 can include at least one cooling fluid conduit 408, 410 (illustrated in connection with sidewall 404 only) and at least one gas conduit 412, 414, 416 (illustrated in connection with sidewall 404 only). Gas conduits 412-416 can be in the form of lines located within sidewall 404, and facing towards the center of substrate retaining apparatus 422. The internal surfaces of gas line/gas conduits 412-416 can be electropolished to prevent particle formation and/or distribution. Although illustrated only in connection with sidewall 404, sidewall 406 can include the same or similar cooling fluid conduits and/or gas conduits. Cooling fluid can enter one of cooling fluid conduits 408, 410 and exit from the other cooling fluid conduit. More particularly, cooling fluid can be received by first cooling fluid conduit 408 from a first opening 748 of baseplate 402 and return from cooling fluid conduit 410 to a second opening 750 within baseplate 402. Similarly, cooling fluid can be received by a first cooling fluid conduit of sidewall 406 from a third opening 752 of baseplate 402 and return from a cooling fluid conduit of sidewall 406 to a fourth opening 754 within baseplate 402. And, gas can enter gas conduits 412-416 via at least one opening—e.g., a plurality of gas openings 756-760 or similar gas conduits in sidewall 406 via gas openings 762-768. The gas flowing through gas conduits (e.g., gas conduits 412-416) may exit the gas conduits through openings in the gas conduits and flow into a space between a heat shield and a substrate, and/or into another component fluidly coupled to such openings (e.g., a heat shield or pad), from the which the gas may subsequently exit, such that the gas contacts and/or cools the substrate. Such openings in the gas conduits may be above, level with, and/or below pads (e.g., pads 418, 420, discussed further herein).

Sidewalls 404 can be coupled to baseplate 402 using any suitable means, such as welding, brazing, ebeam welding or machined as a single block, such that cooling fluid manifold 709 is fluidly coupled to cooling fluid conduit 408 and cooling fluid conduit 713 is fluidly coupled to cooling fluid conduit 410. Similarly, gas conduits 412-416 of sidewall 404 can be fluidly coupled to gas manifold 717. Sidewall 406 can be similarly coupled to baseplate 402, such that corresponding cooling fluid and gas conduits within sidewall 406 are coupled to cooling fluid manifolds 709, 713 and gas manifold 717.

Sidewalls 404, 406 can be formed of, for example, aluminum, stainless steel or off-the-shelf tubing.

Heat shields 424 are configured to mitigate thermal crosstalk between substrates 422. Heat shields 424 can be formed of or include, for example, silicon carbide, stainless steel, or the like. Heat shields 424 can include one or more coatings, such as coatings of emissive material and/or reflective material. For example, one or more heat shields 424 can include an emissive coating comprising an emissive material, such as silicon carbide, black anodized aluminum or black quartz, or the like, proximate a bottom surface of a substrate and/or a reflective coating comprising reflective material, such as electroless nickel plated aluminum/stainless steel or polished stainless steel or the like, proximate a top surface of another substrate. Exemplary heat shields are described in more detail below in connection with FIGS. 8 and 9. Alternatively, heat shields 424 can be formed of the emissive and/or reflective material.

Heat shields 424 can be coupled to one or more of sidewalls 404, 406 using any suitable technique. For example, heat shields 424 can be received within slots formed in one or more of sidewalls 404, 406. Additionally or alternatively, heat shields 424 can be fixedly attached to one or more of sidewalls 404, 406—e.g., by welding (e.g., fillet welding) heat shields 424 to a surface, within a slot, or to a mount (e.g., a pad mount or a heat shield mount) attached to one of sidewalls 404, 406.

By way of illustrative example, as illustrated in FIG. 5, heat shields 424 can be fixedly attached to one of sidewalls 404, 406 (illustrated as (e.g., fillet) welded to sidewall 404) and not fixedly attached—e.g., received within a slot of another sidewall (sidewall 406 in the illustrated example). Welding a portion of a heat shield 424 to one sidewall 404, while not fixedly attaching the heat shield to another sidewall 406 allows the heat shield to expand and contract as substrates are heated and/or cooled on substrate retaining apparatus 400.

Figure 8:
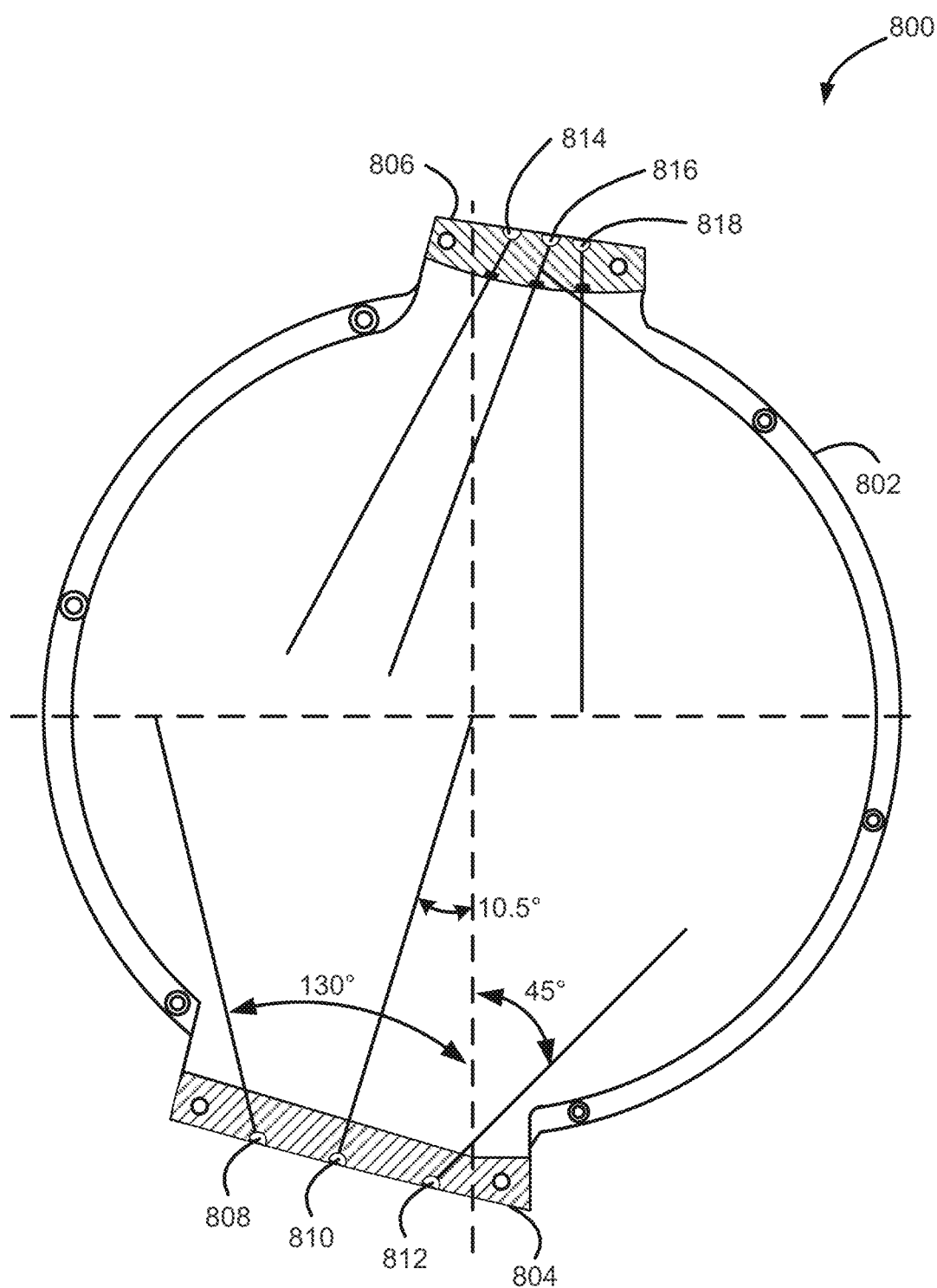
FIG. 8 illustrates a heat shield in accordance with at least one embodiment of the disclosure.

FIG. 8 illustrates a bottom surface of a heat shield 800 suitable for use as heat shield 424, as well as other heat shields described herein. Heat shield 800 can include a body section 802, a first connection section 804, and a second connection section 806. Body section 802 can be substantially shaped as a substrate. By way of example, when a substrate comprises a substantially circular shape, body section 802 can include a substantially circular shape. First connection section 804 and second connection section 806 can be used to attach heat shield to sidewalls—e.g., sidewalls 404 and/or 406. For example, first connection section 804 and second connection section 806 can be received within slots formed within sidewall 404 and 406, respectively. Heat shield 800 can also include openings 808-818 for gas received from a gas conduit within a sidewall (e.g., gas conduit 412-416 of sidewall 404). That is, at least one of openings 808-818 may be fluidly coupled to a gas conduit in a sidewall (e.g., gas conduits 412-416 of sidewall 404). Openings 808-812 can be drilled into a portion of first connection section 804 and openings 814-818 can be drilled into a portion of second connection section 806. As illustrated, openings 808-812 can be angled relative to a centerline through heat shield 800. Openings 814-818 can also be angled, as illustrated in FIG. 8. Openings 808-818 can be further configured, such that the initial flow of gas from openings 808-818 is initially parallel or substantially parallel (e.g., within about 10 degrees of being parallel) across a (top) surface of a substrate (e.g., gas flow 552 shown in FIG. 5). Openings 814-818 may be angled in any suitable configuration to cool the substrate. The flow of the gas from openings 808-818 may cause the gas to contact the substrate (e.g., a top surface of the substrate) and absorb heat from the substrate (i.e., cool the substrate).

Substrate retaining apparatus 400 can also include one or more pads 418, 420, described in more detail below in connection with FIGS. 10A, 10B, 11A and 11B. Pads 418, 420 are configured to retain a substrate 422. Pads 418, 420 can be coupled to sidewalls 404, 406 using one or more pad mounts 502, 504, illustrated in FIG. 5. The pads retaining substrate 422 (e.g., pads 418, 420) may span at least a portion of the distance between sidewalls 404, 406. Pad mounts 502, 504 can be formed of, for example, peek, stainless steel or aluminum. Pad mounts 502, 504 can be coupled to one or more of sidewalls 404, 406 using, for example, welding techniques and/or fasteners. As illustrated, a plurality of pads (e.g., made of peek or quartz or other materials that are stable at high temperatures) 418, 420 and a plurality of heat shields 424 can be in an alternating pattern.

Turning now to FIG. 6, another substrate retaining apparatus 600 is illustrated. Substrate retaining apparatus 600 is similar to substrate retaining apparatus 400, except heat shields 610 are coupled (e.g., removably coupled) to one or more of sidewalls 612 using a fastener, such as a screw or a bolt. Heat shields 610 can be removably attached to one or more or all of sidewalls 404, 406. Sidewall 612 can be similar to sidewalls 404, 406, except sidewall 612 allows for the removable attachment of heat shields 610.

Figure 9:
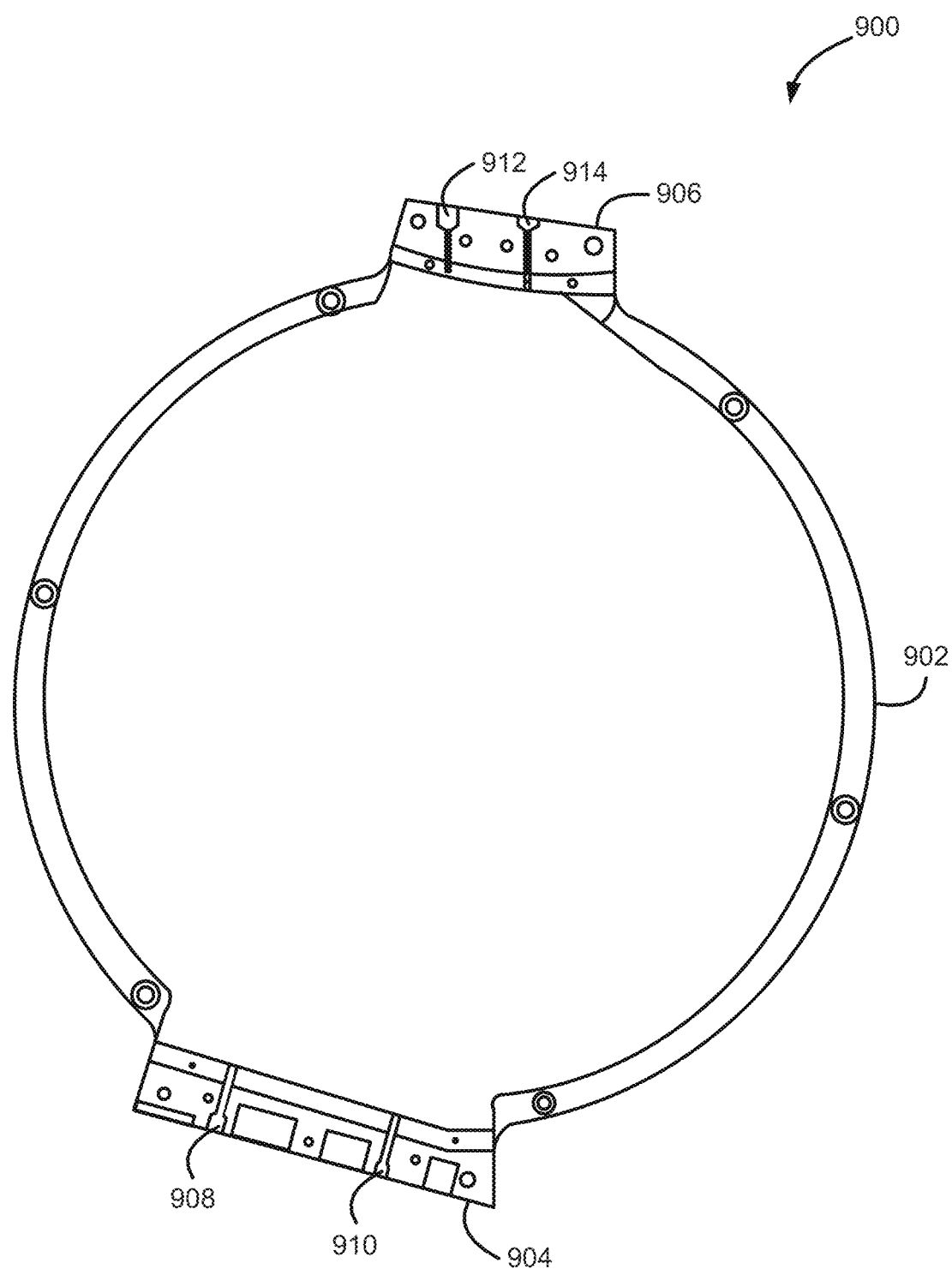
FIG. 9 illustrates another heat shield in accordance with at least one embodiment of the disclosure.

FIG. 9 illustrates a top surface of heat shield 900 suitable for use as heat shield 610. Heat shield 900 can include a body section 902, a first connection section 904, and a second connection section 906. Body section 902 can be substantially shaped as a substrate, and can be the same or similar to body section 802—e.g., substantially circular shaped. First connection section 904 and second connection section 906 can be used to attach heat shield 900 to sidewalls—e.g., sidewalls 404 and/or 406, using one or more fasteners. In the illustrated example, first connection section 904 includes recesses 908, 910 to receive a fastener that connect heat shield 900 to a sidewall. Similarly, second connection section 906 includes recesses 912, 914 to receive a fastener that connects heat shield 900 to a sidewall. A bottom surface of heat shield 900 can include openings, similar to openings 808-818, described above in connection with heat shield 800, such that such openings cause gas flowing through heat shield 900 to enter a space above heat shield 900 and below the substrate, and the gas contacts a (bottom) surface of the substrate to cool the substrate.

Figure 10A:
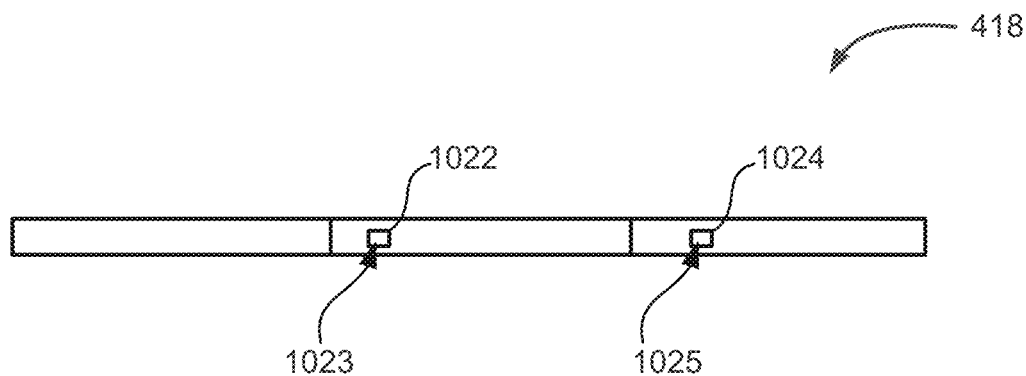
FIGS. 10A and 10B illustrate a pad in accordance with at least one embodiment of the disclosure.
Figure 10B:
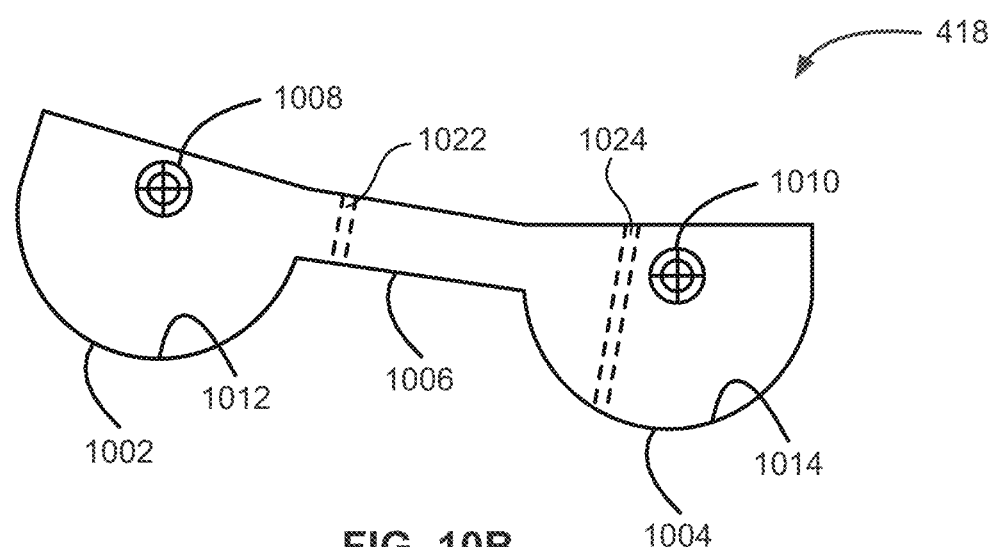

FIG. 10A illustrates a side view and FIG. 10B illustrates a top view of pad 418 in accordance with at least one embodiment of the disclosure. In the illustrated example, pad 418 includes a first section 1002, a second section 1004, and a third section 1006 spanning between and connecting first section 1002 and second section 1004. As illustrated in FIGS. 4-6, a substrate can contact pad 418 on first and/or second section 1002, 1004, such as outer regions 1012, 1014 of first and second sections 1002, 1004, respectively. The substrate may be retained thereon. First section 1002 can include an opening 1008 to receive a fastener, such as a bolt or screw, to allow pad 418 to be coupled to a sidewall, such as sidewall 406 using, e.g., mount 502. Similarly, second section 1004 can include an opening 1010 to receive a fastener, such as a bolt or screw, to allow pad 418 to be coupled to a sidewall, such as sidewall 406 using, e.g., mount 502. When coupled to a sidewall (e.g., sidewall 406), pad 418 may protrude therefrom and span at least a portion of the distance between such sidewall and another sidewall (e.g., sidewall 404).

In various embodiments, a pad (e.g., pad 418) may comprise at least one gas channel (e.g., gas channel 1022 and 1024) disposed through at least a portion of the pad. For example, there may be at least one gas channel disposed in first section 1002, second section 1004, and/or third section 1006. The gas channel may be disposed through at least a portion of the pad thickness (as indicated by the dotted lines of gas channels 1022 and 1024 in FIG. 10B, because gas channels 1022 and 1024 may be between and/or enclosed by top and bottom surfaces of the pad). In various embodiments, the gas channel may be at least partially enclosed by the pad (e.g., pad 418) (e.g., the gas channel may be completely enclosed by the pad thickness between top and bottom surfaces of the pad, or one or more portions of the gas channel may be exposed to the area surrounding the pad). The gas channel may span between two ends, such that the gas channel spans at least a portion of the pad length (i.e., the pad length in the direction that the pad protrudes from a sidewall to which the pad is coupled). In various embodiments, the gas channel in a pad may be in fluid communication with one or more gas conduits of a sidewall (e.g., gas conduits of sidewall 406, similar to gas conduits 412-416 of sidewall 404), such that gas flows through the gas conduits of the sidewall into the gas channel of the pad. The gas flowing through gas channel (e.g., gas channel 1022, 1024) may exit the gas channel through openings in the gas channels and flow into a space between a heat shield and a substrate, such that the gas contacts and/or cools the substrate. For example, there may be one or more openings in a gas channel through a top or a bottom of the pad through which gas may exit, and/or there may be an opening at an end of the gas channel through which gas may exit, to cool the substrate. As depicted in FIG. 10A, gas channels 1022 and 1024 comprise openings 1023 and 1025, respectively, at the end of gas channels 1022 and 1024 such that gas (e.g., nitrogen gas) may exit gas channels 1022 and 1024 under the substrate, and flow substantially parallel (or with any other suitable relationship) to a bottom surface of the substrate (e.g., gas flow 554 shown in FIG. 5). Such flow may cause the gas to contact the bottom of the substrate and cool the substrate.

Figure 11A:
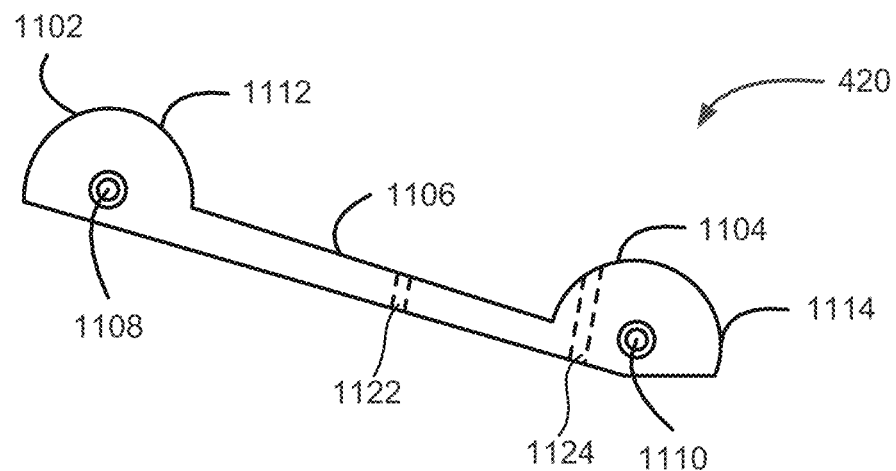
FIGS. 11A and 11B illustrate another pad in accordance with at least one embodiment of the disclosure.
Figure 11B:
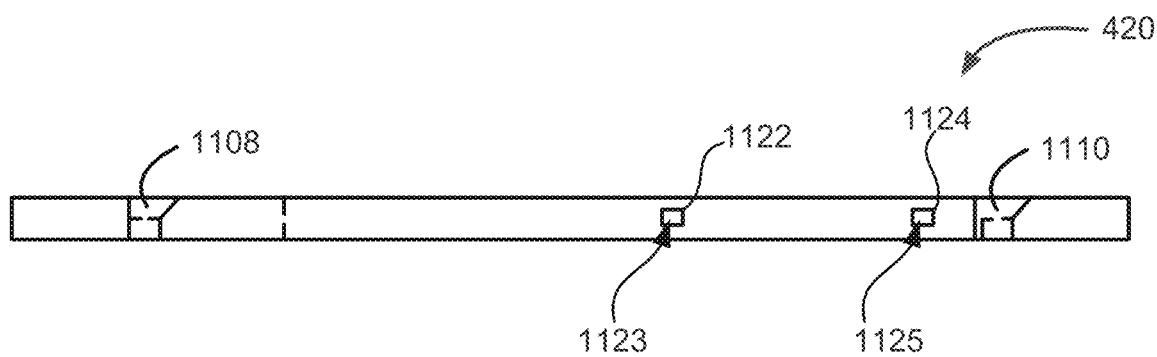

FIG. 11A illustrates a top view and FIG. 11B illustrates a cross-sectional side view of pad 420 in accordance with at least one embodiment of the disclosure. Similar to pad 418, pad 420 can include a first section 1102, a second section 1104, and a third section 1106 spanning between and connecting first section 1102 and second section 1104. A substrate can contact pad 420 on first and/or second section 1102, 1104, such as outer regions 1112, 1114 of first and second sections 1102, 1104, respectively. The substrate may be retained thereon. First section 1102 can include an opening 1108 to receive a fastener, such as a bolt or screw, to allow pad 420 to be coupled to a sidewall, such as sidewall 404 using, e.g., mount 504. Similarly, second section 1104 can include an opening 1110 to receive a fastener, such as a bolt or screw, to allow pad 420 to be coupled to a sidewall, such as sidewall 404 using, e.g., mount 504. When coupled to a sidewall (e.g., sidewall 404), pad 420 may protrude therefrom and span at least a portion of the distance between such sidewall and another sidewall (e.g., sidewall 406).

In various embodiments, a pad (e.g., pad 420) may comprise at least one gas channel (e.g., gas channel 1122 and 1124) disposed through at least a portion of the pad. For example, there may be at least one gas channel disposed in first section 1102, second section 1104, and/or third section 1106. The gas channel may be disposed through at least a portion of the pad thickness (as indicated by the dotted lines of gas channels 1122 and 1124 in FIG. 11A, because gas channels 1122 and 1124 may be between and/or enclosed by top and bottom surfaces of the pad). In various embodiments, the gas channel may be at least partially enclosed by the pad (e.g., pad 420) (e.g., the gas channel may be completely enclosed by the pad thickness between top and bottom surfaces of the pad, or one or more portions of the gas channel may be exposed to the area surrounding the pad). The gas channel may span between two ends, such that the gas channel spans at least a portion of the pad length (i.e., the pad length in the direction that the pad protrudes from a sidewall to which the pad is coupled). In various embodiments, the gas channel in a pad may be in fluid communication with one or more gas conduits of a sidewall (e.g., gas conduits 412-416 of sidewall 404), such that gas flows through the gas conduits of the sidewall into the gas channel of the pad. The gas flowing through a gas channel (e.g., gas channel 1122, 1124) may exit the gas channel through openings in the gas channels and flow into a space between a heat shield and a substrate, such that the gas contacts and/or cools the substrate. For example, there may be one or more openings in a gas channel through a top or a bottom of the pad through which gas may exit, and/or there may be an opening at an end of the gas channel through which gas may exit, to cool the substrate. As depicted in FIG. 11B, gas channels 1122 and 1124 comprise openings 1123 and 1125, respectively, at the ends of gas channels 1122 and 1124 such that gas (e.g., nitrogen gas) may enter/exit gas channels 1122 and 1124 under the substrate, and flow substantially parallel (or with any other suitable relationship) to a bottom surface of the substrate (e.g., gas flow 558 shown in FIG. 5). Such flow may cause the gas to contact the bottom of the substrate and cool the substrate.

Figure 14:
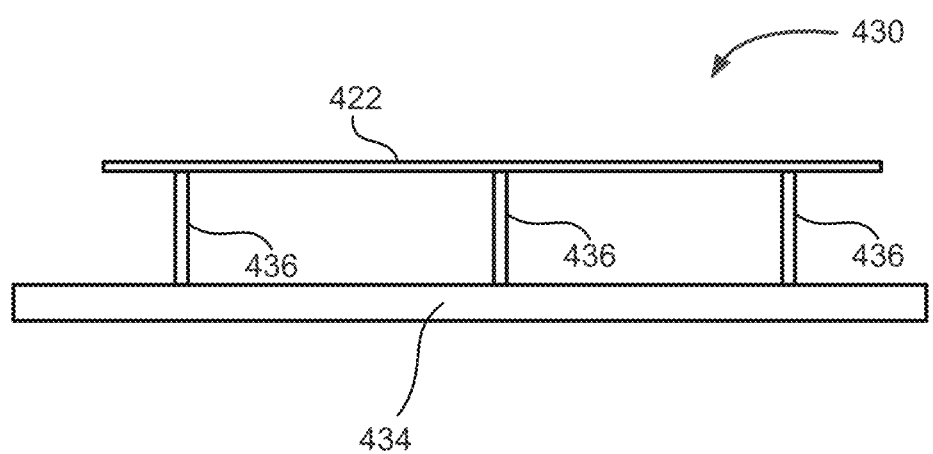
FIG. 14 illustrates a retaining platform of a substrate transfer system in accordance with at least one embodiment of the disclosure.

With reference to FIG. 14, in various embodiments, substrates may be retained in a substrate retaining apparatus (e.g., substrate retaining apparatus 400) by a retaining platform (e.g., retaining platform 430). The retaining platform may comprise may comprise a base (e.g., base 434) that spans at least a portion between the sidewalls of the substrate retaining apparatus substantially parallel to the substrate, and at least one retaining pin (e.g., retaining pins 436) protruding from the retaining platform base. The retaining pin may be configured to support the substrate (e.g., substrate 422), such that the substrate is disposed and rests on the retaining pin(s). Pins 436 allow minimal contact on the substrate, while providing stability and support for the substrate. The retaining platform base may span only a portion of the cross-sectional area of the substrate retaining apparatus, such that the retaining platform base does not completely bifurcate the space in the substrate retaining apparatus between the substrate and the heat shield below the substrate.

The structure of the retaining platform (e.g., retaining platform 430) allows for cooling gas to flow within the space between the substrate and the heat shield below the substrate and contact a majority of the surface area of the substrate bottom surface (because only the small areas of retaining pins 436 are contacting the substrate bottom surface). Therefore, cooling gas flowing through gas conduits in a sidewall (e.g., gas conduits 412-416 in side wall 404) may exit the gas conduits through openings in the gas conduits, flow into the space between a substrate and the heat shield below the substrate (e.g., gas flow 559 in FIG. 5), and surround the retaining platform, such that the gas contacts and/or cools the substrate (e.g., contacts the substrate bottom surface). In various embodiments, the retaining platform base may be coupled to at least one sidewall of the substrate retaining apparatus. In various embodiments, the substrate retaining apparatus may comprise multiple retaining platforms protruding from one or more sidewalls such that at least one retaining pin from each retaining platform is supporting a substrate disposed thereon.

Such flow along the bottom or underside of the substrate (or within the space between the substrate and the heat shield below the substrate) may mitigate any risk of potential contaminants (e.g., particles) in the cooling gas from settling on, interacting with, or otherwise contaminating the substrate. Because the gas may be flowing under the substrate, any contaminants or particulate may settle (e.g., via gravity) on the heat shield below the substrate (e.g., the heat shield below the substrate and above another substrate), rather than on the substrate. Additionally, the substrates (e.g., substrates 220) may be disposed on the pads (e.g., pads 418, 420) and/or retaining platforms (e.g., retaining platform 430) in an arrangement that prevents (partially or wholly) particles and/or cooling gas from contacting a top surface of the substrate (e.g., by creating a seal between the substrate and the pads and/or sidewalls). The particles settling on the heat shield allows mitigation of the risk of decreasing the quality, purity, and efficacy of the substrates that may be caused by particles and/or other contaminants interfering or otherwise contaminating the substrates (cooling gas flowing above, and contacting the top surface of, the substrate, may cause particles or other contaminants settle on the substrate). The bottom of the substrate may also comprise a looser tolerance (i.e., a larger acceptable margin of error, difference, or impurity) than the top of the substrate. Therefore, because the cooling gas affects the less-sensitive (i.e., less prone to damaging effects from contaminants) bottom of the substrate, rather than the more-sensitive top, the substrate top may be at least partially protected from risk of damage from the cooling gas.

Figure 12:
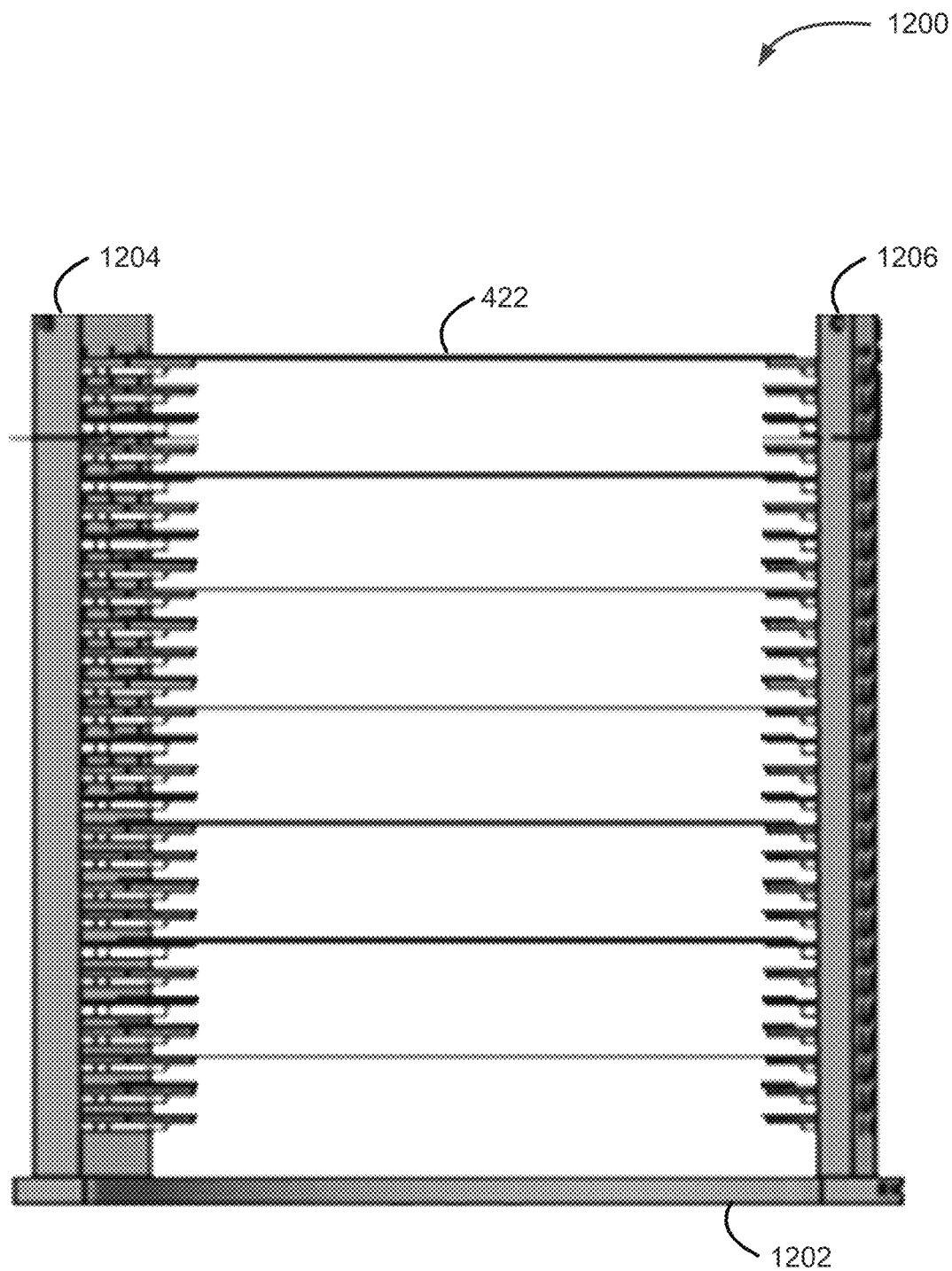
FIG. 12 illustrates a substrate retaining apparatus in accordance with another exemplary embodiment of the disclosure.

FIG. 12 illustrates yet another substrate retaining apparatus 1200 in accordance with another exemplary embodiment of the disclosure. Substrate retaining apparatus 1200 can include a baseplate 1202 and sidewalls 1204, 1206. Substrate retaining apparatus 1200 can be similar to substrate retaining apparatus 400 or 600, except substrate retaining apparatus 1200 does not necessarily include water cooling conduits in baseplate 1202 and/or sidewalls 1204, 1206. Rather, substrate retaining apparatus 1200 can include additional space between substrates (e.g., a spacing of between about 20 mm and about 60 mm) to facilitate cooling and/or mitigate thermal crosstalk between substrates. Similar to substrate retaining apparatus 400 and 600, substrate retaining apparatus 1200 can include gas conduits in baseplate 1202 and/or sidewalls 1204, 1206. The gas conduits can be the same or similar to those described above in connection with FIGS. 4-7.

As noted above, reactor systems, such as reactor system 200, can include a substrate transfer system to move substrates between substrate retaining apparatus (e.g., substrate retaining apparatus 302, 400 or 600) and a reaction chamber. Exemplary substrate transfer systems can include a robotic arm that can include, for example, a vacuum robot blade or a robotic blade.

Figure 13:
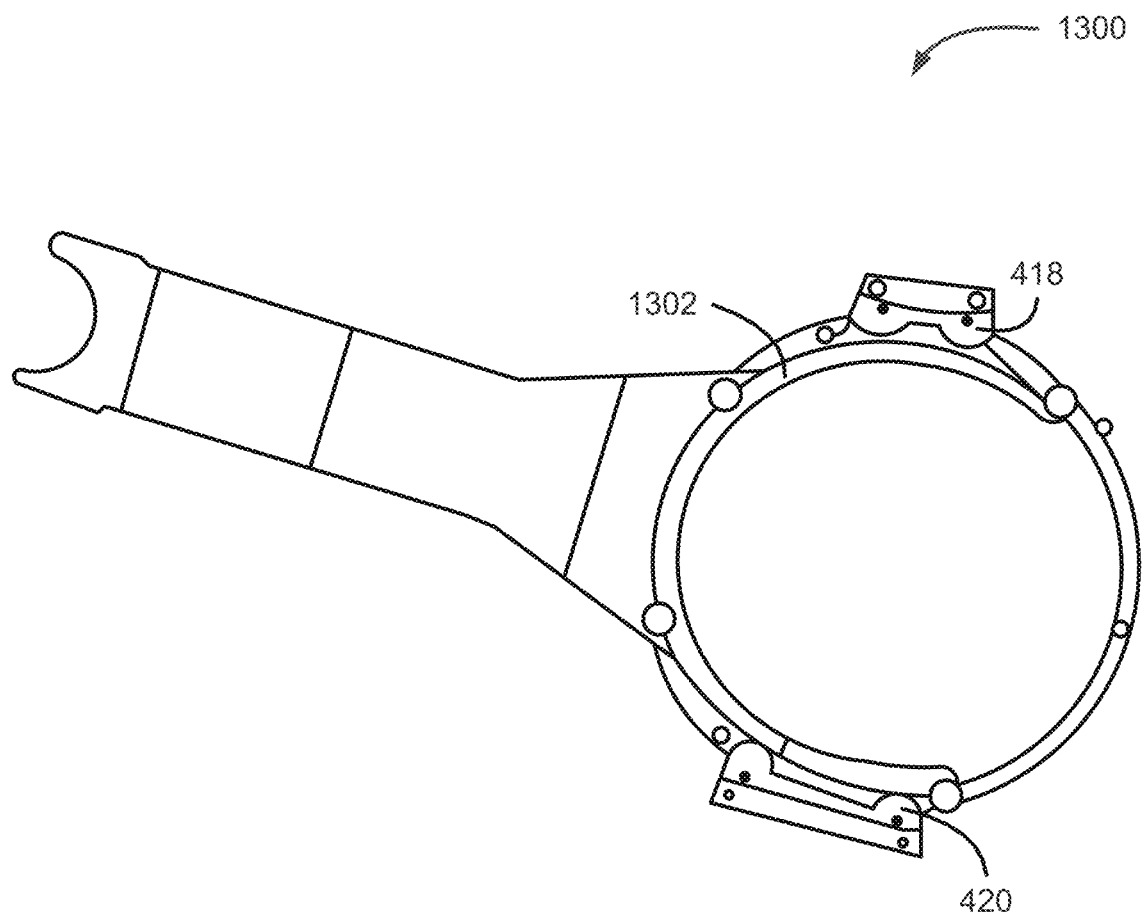
FIG. 13 illustrates a robotic blade of a substrate transfer system in accordance with at least one embodiment of the disclosure.

FIG. 13 illustrates an exemplary (e.g., vacuum) robotic blade 1300 suitable for use with substrate handling system 214. Robotic blade 1300 can include a (e.g., partially circular) section 1302 that can retain the substrate during transfer. As illustrated in FIG. 13, section 1302 can be sized to fit between pads 418, 420 and/or between adjacent heat shields 424, 610 and a substrate.

Although exemplary embodiments of the present disclosure are set forth herein, it should be appreciated that the disclosure is not so limited. For example, although substrate retaining apparatus, load lock assemblies, and reactor systems are described in connection with various specific configurations, the disclosure is not necessarily limited to these examples. Various modifications, variations, and enhancements of the apparatus, assemblies, and systems set forth herein may be made without departing from the spirit and scope of the present disclosure.

Unless otherwise stated, the subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A substrate retaining apparatus comprising:
   a baseplate;
   at least one sidewall coupled to the baseplate, wherein the at least one sidewall comprises at least one cooling fluid conduit, configured to allow a liquid cooling fluid to flow there through, and at least one gas conduit;
   at least one pad coupled to and projecting from a sidewall of the at least one sidewall, the at least one pad configured to receive a substrate; and
   at least one heat shield coupled to at least one of the at least one sidewall, wherein the at least one heat shield comprises a top surface, a bottom surface, and at least one opening on the bottom surface of the at least one heat shield, the at least one opening is fluidly coupled to the at least one gas conduit in the at least one sidewall, wherein the at least one opening is formed within the at least one heat shield.

2. The substrate retaining apparatus of claim 1 comprising at least two sidewalls, wherein the at least one heat shield is fixedly attached to at least one of the at least two sidewalls and is coupled but not fixedly attached to at least one of the at least two sidewalls.

3. The substrate retaining apparatus of claim 1, wherein the baseplate comprises a cooling fluid manifold.

4. The substrate retaining apparatus of claim 1, wherein the at least one opening is drilled into a portion of a first connection section of the at least one heat shield.

5. The substrate retaining apparatus of claim 1, wherein the sidewall further comprises at least one gas opening fluidly coupled to the at least one gas conduit, wherein the at least one gas opening is above the at least one pad.

6. The substrate retaining apparatus of claim 1, wherein the sidewall further comprises at least one gas opening fluidly coupled to the at least one gas conduit, wherein the at least one gas opening is positioned to flow gas to a bottom side of the substrate and not a top side of the substrate when the substrate is disposed on the at least one pad.

7. The substrate retaining apparatus of claim 1, further comprising a pad mount coupled to a pad of the at least one pad and to the sidewall.

8. The substrate retaining apparatus of claim 1, wherein the at least one heat shield comprises nickel.

9. The substrate retaining apparatus of claim 1, wherein the at least one heat shield comprises one or more of silicon carbide and stainless steel.

10. The substrate retaining apparatus of claim 1, comprising a plurality of pads coupled to the sidewall and a plurality of heat shields coupled to the sidewall, wherein the plurality of pads and the plurality of heat shields are in an alternating configuration.

11. The substrate retaining apparatus of claim 1, wherein the at least one heat shield is removably coupled to the at least one sidewall using a fastener.

12. The substrate retaining apparatus of claim 1, wherein the at least one pad comprises quartz.

13. The substrate retaining apparatus of claim 1, wherein the at least one heat shield is fixedly coupled to the sidewall.

14. The substrate retaining apparatus of claim 1, wherein the substrate retaining apparatus comprises between about 2 to about 25 heat shields.

15. The substrate retaining apparatus of claim 1, wherein the sidewall further comprises a plurality of gas openings fluidly connected to the at least one gas conduit, and wherein the at least one heat shield comprises a plurality of openings fluidly connected to the plurality of gas openings of the sidewall.

16. A reactor system comprising the substrate retaining apparatus of claim 1.

17. The substrate retaining apparatus of claim 1, wherein the at least one opening is angled to contact the substrate with a gas from the at least one gas conduit.

18. A heat shield comprising:
a body section, wherein the body section comprises a top surface and a bottom surface, and wherein the body section comprises a substantially circular cross-sectional shape;
a first connection section, wherein the first connection section comprises a first flat edge surface, a first section top surface, a first section bottom surface, and a first recess configured to receive a first fastener; and
a second connection section, wherein the second connection section comprises a second flat edge surface, a second section top surface, a second section bottom surface, and a second recess configured to receive a second fastener, wherein the first connection section and the second connection section are disposed on substantially opposite sides of the body section.

19. The heat shield of claim 18, wherein the first connection section is offset from the second connection section, and the first flat edge surface is not parallel to the second flat edge surface.

20. The heat shield of claim 19, wherein a length of the first flat edge surface is greater than a length of the second flat edge surface.

* * * * *